United States Patent
Chuang

(10) Patent No.: US 7,038,425 B2
(45) Date of Patent: May 2, 2006

(54) METHOD OF MEASURING AND DISPLAYING ACTUAL QUANTITY OF ELECTRICITY OF RECHARGEABLE BATTERY BEING CHARGED BY EXTERNAL POWER SOURCE VIA CHARGER

(75) Inventor: Chi-Chang Chuang, Taipei (TW)

(73) Assignee: QQE Technology Co., Ltd., Taipei (TW)

( * ) Notice: Subject to any disclaimer, the term of this patent is extended or adjusted under 35 U.S.C. 154(b) by 174 days.

(21) Appl. No.: 10/734,178

(22) Filed: Dec. 15, 2003

(65) Prior Publication Data

US 2005/0127876 A1 Jun. 16, 2005

(51) Int. Cl.
*H01M 10/44* (2006.01)
(52) U.S. Cl. .................................... 320/132
(58) Field of Classification Search .......... 320/104, 320/107, 128, 132
See application file for complete search history.

(56) References Cited

U.S. PATENT DOCUMENTS

| 4,217,645 A | * | 8/1980 | Barry et al. ............... 320/132 |
| 4,560,937 A | * | 12/1985 | Finger ........................ 320/149 |
| 4,568,934 A | * | 2/1986 | Allgood .................. 340/870.02 |
| 5,955,869 A | * | 9/1999 | Rathmann .................... 320/132 |
| 6,211,681 B1 | * | 4/2001 | Kagawa et al. ............. 320/104 |
| 6,891,355 B1 | * | 5/2005 | Kernahan .................... 320/132 |

FOREIGN PATENT DOCUMENTS

| TW | 507412 | 10/2002 |
| TW | 522624 | 3/2003 |
| TW | 533646 | 5/2003 |

* cited by examiner

*Primary Examiner*—Edward H. Tso
(74) *Attorney, Agent, or Firm*—Birch, Stewart, Kolasch & Birch,LLP

(57) ABSTRACT

A method of measuring and displaying the actual quantity of electricity of a rechargeable battery being charged by an external power source via a charger. The method includes issuing a power out signal from the charger to temporarily disable the power source; sending a signal indicating the actual quantity of electricity of the battery as feedback to the controller in response to the disabled power source; and configuring the controller to have a reference voltage so as to compare the reference voltage with a voltage of the feedback actual quantity of electricity of the rechargeable battery to obtain a voltage ratio, and issue a display signal to a display for displaying a correct measurement based on the voltage ratio.

10 Claims, 3 Drawing Sheets

METHOD OF MEASURING AND DISPLAYING ACTUAL QUANTITY OF ELECTRICITY OF RECHARGEABLE BATTERY BEING CHARGED BY EXTERNAL POWER SOURCE VIA CHARGER

FIELD OF THE INVENTION

The present invention relates to methods of measuring and displaying the actual quantity of electricity of a rechargeable battery and more particularly to an improved method of measuring the actual quantity of electricity of such rechargeable battery being charged when an external power source is temporarily disabled.

BACKGROUND OF THE INVENTION

One benefit of a rechargeable battery is that a user does not need to worry about an unexpected power out of the electrical device being used. Further, the rechargeable battery has the advantages of being portable, reusable, convenient in use, and environment friendly. Hence, rechargeable batteries are widely used in many applications due to the significant increase of capacity and technological advancements of charge materials. For example, a rechargeable battery has been installed in a small home appliance (e.g., stereo). More recently, how to equip a motor vehicle (e.g., motorcycle or car) with one or more rechargeable batteries for making it battery operated has become more important. Hence, it is critical to correctly measure the quantity of electricity of a rechargeable battery.

R.O.C. Patent Publication No. 507,412 entitled "Rechargeable Battery Charger, Method of Charging A Rechargeable Battery, and Rechargeable Battery Assembly" disclosed a rechargeable battery charger for charging batteries of a rechargeable battery assembly. The rechargeable battery assembly is able to record data of the maximum charge current of the batteries and data of the maximum charge voltage of the batteries, and has means of communicating data and a memory of storing digital data representing the maximum charge voltage. Another R.O.C. Patent Publication No. 522,624 entitled "Rechargeable Battery Charger, Rechargeable Battery Assembly, And Method of Secondarily Charging The Rechargeable Battery" disclosed a small charger adapted to charge a number of rechargeable batteries in a reduced period of time.

The above two charge methods have fully disclosed techniques of how to effectively charge one or more rechargeable batteries in a minimum period of time. However, for a user it is more important to know the actual quantity of electricity of a rechargeable battery prior to use. Thereafter, the user is able to determine about when he/she will charge the battery again or replace it with a new one after using it for a period of time in the future. A further R.O.C. Patent Publication No. 533,646 entitled "Rechargeable Battery Charging System and Rechargeable Battery Charger Thereof" disclosed a microcontroller employing an algorithm to monitor the charge state of rechargeable battery and generate a control signal therefor, and supply optimum voltage and current to charge the rechargeable battery. The patent has a feature of measuring the quantity of electricity of the rechargeable battery. However, there is only one measurement of determining whether the rechargeable battery is charged or not. In fact, the patent does not teach how to measure the actual quantity of electricity of a rechargeable battery being charged.

In view of the above, it is understood that the prior art is able to only determine whether a rechargeable battery is fully charged or not. This feature does not help too much for most users. For example, for driving a battery operated motorcycle, there is no way for the driver to know a maximum distance that the vehicle can travel in one charge since the driver does not know the actual quantity of electricity stored in the rechargeable battery. Further, there is no way for the driver to know the charge time. These problems really bother users.

In addition, the conventional technique of measuring the actual quantity of electricity of a rechargeable battery involves measuring the battery directly during charge. However, the measured actual quantity of electricity of the battery being charged may be not the actual quantity of electricity thereof since the battery is being charged by an external power source. Hence, it is typical that the measurement is higher than the actual quantity of electricity of the battery. In other words, the measurement is not correct. This in turn may cause an incorrect determination of the actual quantity of electricity of a rechargeable battery being charged by a user. Hence, a need for improvement exists.

SUMMARY OF THE INVENTION

It is an object of the present invention to provide a method of measuring and displaying an actual quantity of electricity of a rechargeable battery being charged by an external power source via a charger. The method comprises issuing a predetermined power out signal from the charger to temporarily disable the external power source; sending a signal indicating the actual quantity of electricity of the rechargeable battery as feedback to the controller in response to the disabled external power source; and configuring the charger to have a predetermined reference voltage so as to compare the reference voltage with a voltage of the feedback actual quantity of electricity of the rechargeable battery to obtain a voltage ratio with respect to the actual quantity of electricity of the rechargeable battery, and issue a display signal to a display for displaying a measurement based on the voltage ratio. By utilizing the present invention, it is possible to quickly, visually observe the actual quantity of electricity of the rechargeable battery being charged from the display. Moreover, a feedback mechanism is adopted by the present invention so as to correct the voltage of the rechargeable battery during charge, and thus eliminate any undesired pseudo voltage of the external power source. As a result, the feedback quantity of electricity of the rechargeable battery will be approaching a correct, actual one at the end of charging process, thus enabling a user to reliably refer to the readout in use.

DETAILED DESCRIPTION OF THE PREFERRED EMBODIMENTS

The above and other objects, features and advantages of the present invention will become apparent from the following detailed description taken with the accompanying drawings.

Figure 1:
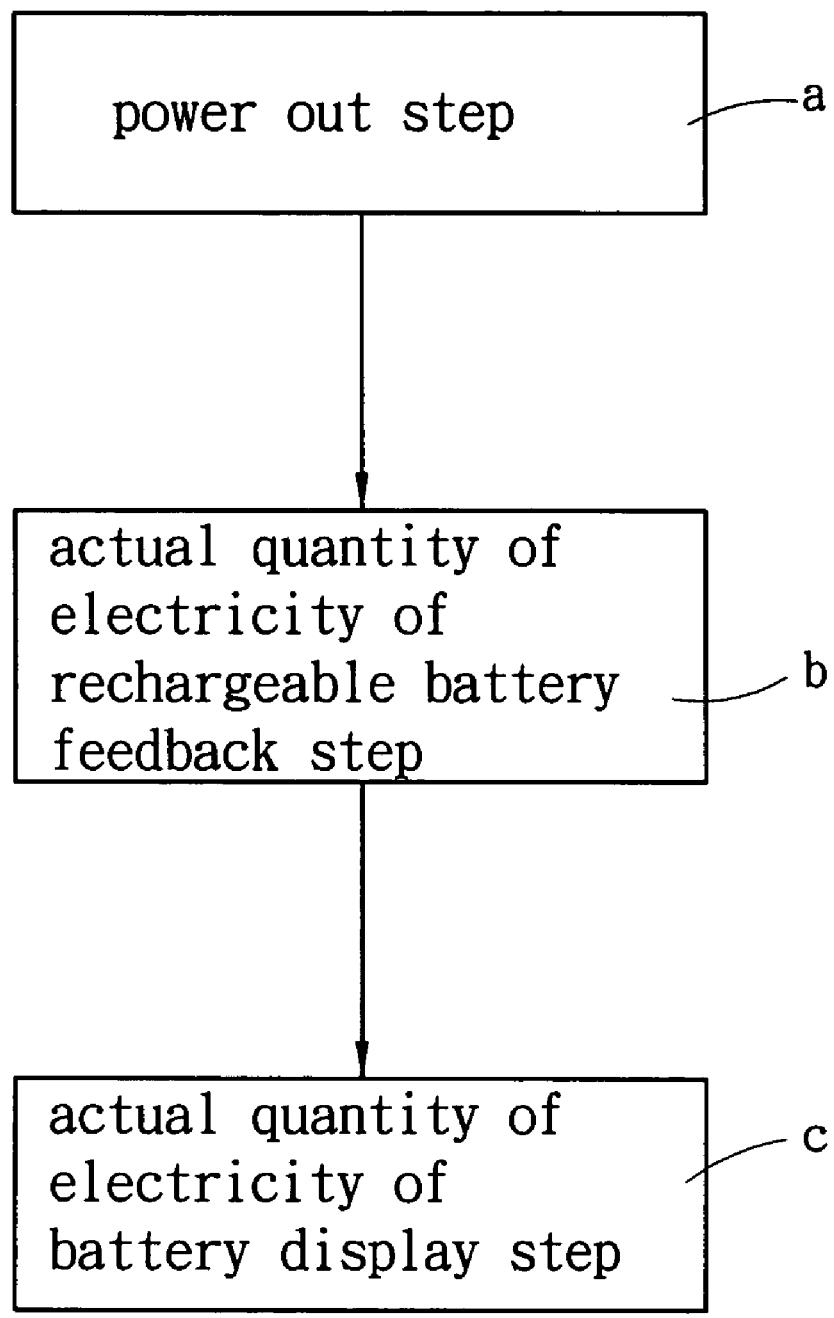
FIG. 1 is a flow chart illustrating a measure process according to the invention.
Figure 2:
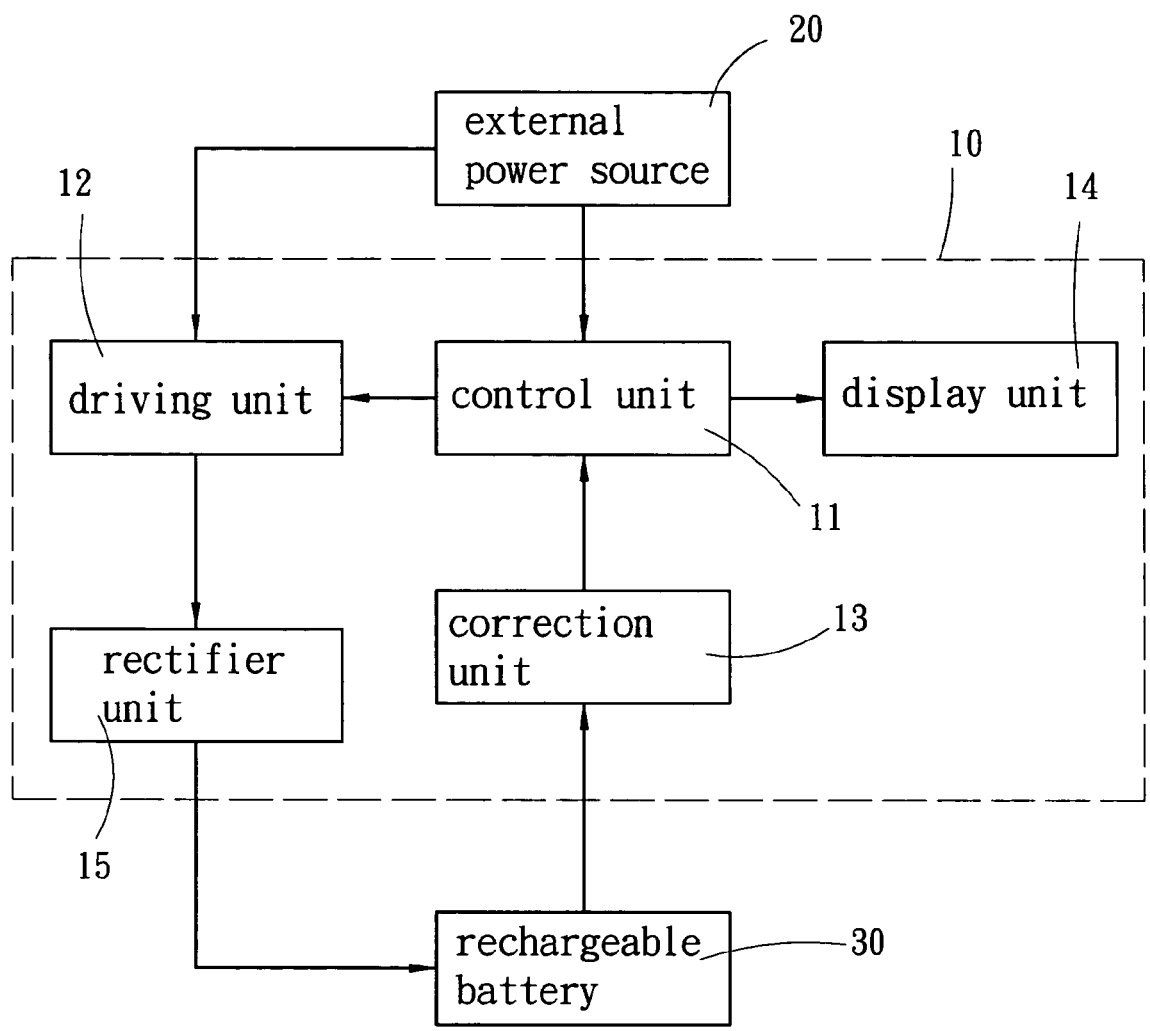
FIG. 2 is an electrical block diagram of the invention.

Referring to FIGS. 1 and 2, a method of measuring and displaying the actual quantity of electricity of a rechargeable battery 30 being charged by a charger 10 constructed in accordance with the invention is illustrated. The charger 10 is adapted to measure the actual quantity of electricity of the rechargeable battery 30 during charge. The charger 10 comprises a control unit 11 having a predetermined reference voltage, the control unit 11 being adapted to issue an output charge signal or a power out signal to an external power source 20 for causing it to charge or stop charging, the control unit 11 receives a feedback of the actual quantity of electricity from the rechargeable battery 30 being charged when the external power source 20 is temporarily disabled, compare the feedback of the actual quantity of electricity with the reference voltage for obtaining a voltage ratio, and the control unit 11 issues a display signal based on the voltage ratio; a driving unit 12 for receiving the charge signal and converting the same into a driving signal for output or receiving the power out signal; a rectifier unit 15 for receiving the driving signal, converting AC (alternating current) input from the external power source 20 into DC (direct current), and charging the rechargeable battery 30 with DC; and a display unit 14 for receiving the display signal prior to display.

An operating method of the charger 10 of the invention will now be described in detail below.

(i) Charging mode of the rechargeable battery 30. The control unit 11 issues an output charge signal to the driving unit 12. Next, the driving unit 12 converts the charge signal by means of photocoupling in a resonance frequency into a driving signal which in turn, is sent to the rectifier 15. The rectifier 15 then converts AC input from the external power source 20 via the driving unit 12 into DC in response to the driving signal, and charges the rechargeable battery 30 with DC in a constant current (CC) mode. Note that battery charging is a well known technique. Thus a detailed description thereof is omitted herein for the sake of brevity.

(ii) Measurement of the actual quantity of electricity of the rechargeable battery 30. It comprises the following steps:

(a) Power out step. The charger 10 will be charged in either an initialization or not by the external power source 20 controlled by the control unit 11. The control unit 11 is adapted to issue an output power out signal to the driving unit 12 in a predetermined time interval. The driving unit 12 will temporarily disable the external power source 20 in response to the received power out signal. That is, charging the rechargeable battery 30 by the external power source 20 is temporarily disabled.

(b) Quantity of electricity of the rechargeable battery 30 feedback step. The rechargeable battery 30 is adapted to simultaneously feedback a signal indicating an actual quantity of electricity thereof to the control unit 11 in response to the power out of the external power source 20. For more precisely indicating voltage of the rechargeable battery 30, an additional correction unit 13 is provided in the feedback path between the control unit 11 and the rechargeable battery 30. The correction unit 13 is adapted to correct the voltage of the rechargeable battery 30 for eliminating any undesired pseudo voltage of the external power source 20 occurred in the initialization. As an end, the feedback quantity of electricity of the rechargeable battery 30 will be approaching a correct, actual one as the charging process continues.

(c) Display step. As stated above, the control unit 11 has a reference voltage. Thus, the feedback actual quantity of electricity of the rechargeable battery 30 is compared with the reference voltage to obtain a voltage ratio with respect to the actual quantity of electricity of the rechargeable battery 30. The control unit 11 is adapted to issue a display signal to the display unit 14 based on the voltage ratio. In one embodiment, the display unit 14 is an LED (light-emitting diode) assembly including a number of LEDs each for emitting light having a unique color or representing measured quantities in percentage so that a user can visually observe the actual quantity of electricity of the rechargeable battery 30. Alternatively, the display unit 14 is implemented as a liquid crystal display or seven-segment display. Also, a user can quickly, visually observe the actual quantity of electricity of the rechargeable battery 30 from the charger 10. The charger 10 is adapted to charge a lead acid, nickel hydrogen, or nickel cadmium type rechargeable battery 30.

Figure 3:
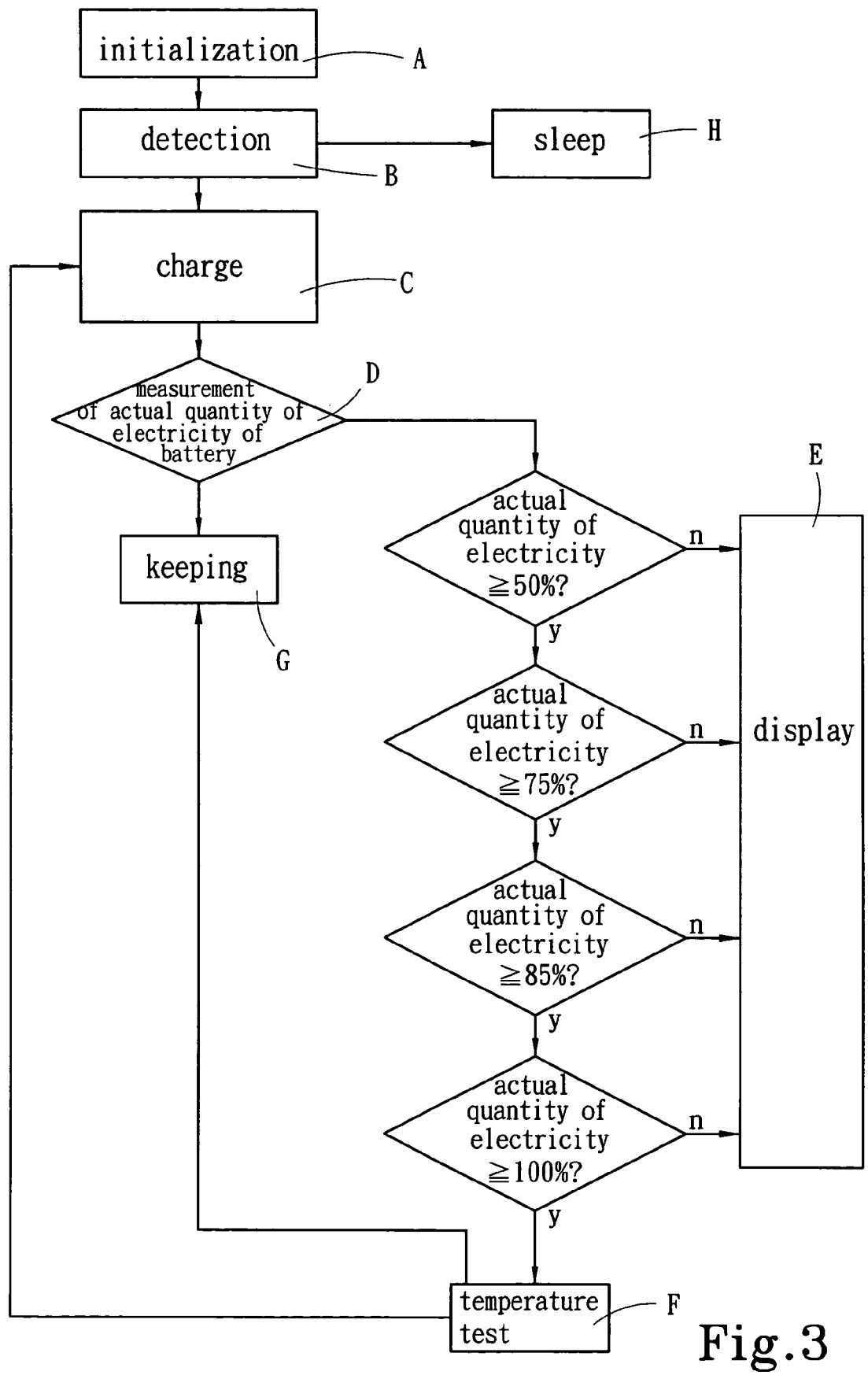
FIG. 3 is a flow chart showing a sequence of method steps performed by the charger with respect to the rechargeable battery according to the invention.

Referring to FIG. 3, there is shown a flow chart illustrating a sequence of method steps performed by the charger 10 with respect to the rechargeable battery 30 according to the invention. The steps are described below.

(A) Initialization (step A). A charge time, a predetermined reference voltage, and a voltage ratio of the rechargeable battery 30 will be set in BIOS (basic input output system) of the control unit 11 based on types and capacity of the rechargeable battery 30.

(B) Detection mode (step B). The charger 10 will determine whether the rechargeable battery 30 is ready to charge once the rechargeable battery 30 is coupled to the charger 10. In detail, the charger 10 charges the rechargeable battery 30 for a first short period of time and thereafter temporarily disables the external power source 20 to obtain a measured voltage V1. Next, the charger 10 charges the rechargeable battery 30 for a second short period of time and thereafter temporarily disables the external power source 20 to obtain another measured voltage V2. It is determined that the rechargeable battery 30 is in disabled state if $V2 \leq V1$. In other words, it is impossible of charging the rechargeable battery 30 by the external power source 20 by means of the charger 10. The charger 10 immediately enters into a sleep mode (step H). At the same time, the control unit 11 issues a display signal to the display 14 for informing user of replacing the dead rechargeable battery 30 prior to charging again.

(C) Charge mode (step C). The charger 10 will charge the rechargeable battery 30 in a CC mode based on the charging step of FIG. 2 after the rechargeable battery 30 has passed the detection mode test (step B). Preferably, a plurality of time intervals of charge are set in the charge mode step C so that a user can immediately know the actual quantity of electricity of the rechargeable battery 30 being charged.

(D) Measurement of the actual quantity of electricity of the rechargeable battery 30 (step D). The control unit 11 will issue a power out signal to the driving unit 12 for temporarily disabling the external power source 20 at the end of each time interval of charge set in the charge mode step C. At this time, the rechargeable battery 30 feedbacks the actual quantity of electricity thereof to the control unit 11 via the correction unit 13. Next, the control unit 11 compares the feedback voltage with the reference voltage to obtain a voltage ratio.

(E) Display mode (step E). The controller 11 will issue a display signal to the display unit 14 in response to the voltage ratio. In the embodiment, the voltage ratio is one of $\geq 50\%$, $\geq 75\%$, $\geq 85\%$, or 100%. As stated above, the voltage ratio is set in the control unit 11 based on types and capacity of the rechargeable battery 30. That is, the setting of the voltage ratio can be changed based on applications. Further, a display can be shown in either an LED assembly or seven-segment display. A user can determine the actual quantity of electricity of the rechargeable battery 30 by visually observing the quantity of electricity displayed on the display unit 14. This can help the user determine a future use time of the charged rechargeable battery 30.

(F) Temperature test mode (step F). A temperature test will be conducted with respect to the rechargeable battery 30 after the end of each time interval of charge but before an immediately next time interval of charge. This temperature test aims at knowing an undesired rise of temperature of the rechargeable battery 30 so as to take immediate actions for preventing the rechargeable battery 30 from burning out if such occurs.

(G) Keeping mode (step G). In a case of the rechargeable battery 30 not removed by a user after the predetermined charge time has passed or the rechargeable battery 30 has been completely charged, the charger 10 enters into a keeping mode in step G. In step G, the charger 10 will send a series of charge pulses to the rechargeable battery 30 for keeping the current charged state of the rechargeable battery 30.

In brief, the method of the invention is able to measure the actual quantity of electricity of a rechargeable battery being charged in a detection mode when an external power source is temporarily disabled. As such, a user can precisely determine the actual quantity of electricity of the rechargeable battery by visually observing the quantity of electricity displayed on the display 14. This can help the user determine a future use time of the charged rechargeable battery.

While the invention herein disclosed has been described by means of specific embodiments, numerous modifications and variations could be made thereto by those skilled in the art without departing from the scope and spirit of the invention set forth in the claims.

What is claimed is:

1. A method of measuring and displaying an actual quantity of electricity of a rechargeable battery being charged by an external power source via a charger, the method comprising the steps of:
   (a) issuing a predetermined power out signal from said charger to temporarily disable the external power source;
   (b) sending a signal indicating the actual quantity of electricity of said rechargeable battery as feedback to said charger in response to said disabled external power source; and
   (c) configuring said charger to have a predetermined reference voltage so as to compare said reference voltage with a voltage of said feedback actual quantity of electricity of said rechargeable battery to obtain a voltage ratio with respect to the actual quantity of electricity of the rechargeable battery, and issue a display signal to a display for displaying a measurement based on said voltage ratio.

2. The method of measuring and displaying an actual quantity of electricity of rechargeable battery according to claim 1, wherein said display is an LED assembly.

3. The method of measuring and displaying an actual quantity of electricity of rechargeable battery according to claim 1, wherein said display is a liquid crystal display.

4. The method of measuring and displaying an actual quantity of electricity of rechargeable battery according to claim 1, wherein said display is a seven-segment display.

5. The method of measuring and displaying an actual quantity of electricity of rechargeable battery according to claim 1, wherein said rechargeable battery is a lead acid type rechargeable battery.

6. The method of measuring and displaying an actual quantity of electricity of rechargeable battery according to claim 1, wherein said rechargeable battery is a nickel hydrogen type rechargeable battery.

7. The method of measuring and displaying an actual quantity of electricity of rechargeable battery according to claim 1, wherein said rechargeable battery is a nickel cadmium type rechargeable battery.

8. The method of measuring and displaying an actual quantity of electricity of rechargeable battery according to claim 1, wherein said external power source supplies power to the rechargeable battery via the charger in a constant current (CC) mode.

9. The method of measuring and displaying an actual quantity of electricity of rechargeable battery according to claim 1, wherein said charger comprises:
   a control unit having a predetermined reference voltage, said control unit issuing an output charge signal or a power out signal to said external power source for charging or stopping charging the external power source, receiving said feedback actual quantity of electricity from said rechargeable battery when said external power source is temporarily disabled, comparing said voltage of said feedback actual quantity of electricity of said rechargeable battery with said reference voltage for obtaining a voltage ratio, and issuing a display signal based on said voltage ratio;
   a driving unit for receiving said charge signal and converting said charge signal into a driving signal for output or receiving the power out signal;
   a rectifier unit for receiving said driving signal, converting AC input from said external power source into DC, and charging said rechargeable battery with DC; and
   a display unit for receiving said display signal prior to display.

10. The method of measuring and displaying an actual quantity of electricity of rechargeable battery according to claim 9, further comprising a correction unit between said control unit and said rechargeable battery.

* * * * *